(12) United States Patent
Sandström

(10) Patent No.: US 6,903,859 B2
(45) Date of Patent: Jun. 7, 2005

(54) HOMOGENIZER

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 43 days.

(21) Appl. No.: 10/308,917

(22) Filed: Dec. 3, 2002

(65) Prior Publication Data

US 2003/0123152 A1 Jul. 3, 2003

Related U.S. Application Data

(60) Provisional application No. 60/337,773, filed on Dec. 7, 2001.

(51) Int. Cl.$^7$ ............................................. G02B 26/00
(52) U.S. Cl. ...................................... 359/290; 359/627
(58) Field of Search ................................ 359/290, 291, 359/292, 627

(56) References Cited

U.S. PATENT DOCUMENTS

| | | | |
|---|---|---|---|
| 3,754,814 A | | 8/1973 | Leith |
| 3,802,762 A | | 4/1974 | Kiemle |
| 4,475,027 A | * | 10/1984 | Pressley .................. 219/121.6 |
| 4,748,614 A | | 5/1988 | Dammann et al. |
| 4,819,033 A | | 4/1989 | Yoshitake et al. |
| 5,056,039 A | * | 10/1991 | Caulfield ..................... 706/40 |
| 5,414,559 A | | 5/1995 | Burghardt et al. |
| 5,495,280 A | | 2/1996 | Gehner et al. |
| 6,002,520 A | | 12/1999 | Hoch et al. |
| 6,067,306 A | | 5/2000 | Sandstrom et al. |
| 6,069,739 A | | 5/2000 | Borodovsky et al. |
| 6,163,403 A | * | 12/2000 | Carrott et al. .............. 359/561 |
| 6,169,634 B1 | | 1/2001 | Sirat |
| 2002/0159044 A1 | | 10/2002 | Mei et al. |

FOREIGN PATENT DOCUMENTS

| | | |
|---|---|---|
| WO | 99/45439 | 9/1999 |
| WO | WO 02/057851 A1 | 7/2002 |

OTHER PUBLICATIONS

P. Kruit "High Throughout Electron Lithography With the Multiple Aperture Pixel By Pixel Enhancement of Resolution Concept" J. Vac. Sci. Technol. B. 16(6) Nov/Dec 1998 American Vacuum Society pp. 3177–3180.

* cited by examiner

*Primary Examiner*—Ricky Mack
(74) *Attorney, Agent, or Firm*—Ernest J. Beffel, Jr.; Haynes Beffel & Wolfed LLP

(57) ABSTRACT

An aspect of the present invention includes a method for homogenizing a beam of electromagnetic radiation. Said beam of electromagnetic radiation is impinged onto a first array of deflecting elements. Said beam of electromagnetic radiation is dispersed into a number of spatially separated beamlets by said first array of deflecting elements. Said beamlets are deflected by said first array of deflecting elements. Said deflected beamlets are impinged onto a second array of deflecting elements. Said beamlets are superimposed at a target plane to thereby form a radiation beam having a homogenized spatial intensity distribution. The invention also relates to an apparatus for homogenizing a beam of electromagnetic radiation.

30 Claims, 1 Drawing Sheet

HOMOGENIZER

PRIORITY CLAIM

This application claims the benefit of Provisional Application No. 60/337,773, filed 07 Dec. 2001 entitled Homogenizer, invented by Torbjörn Sandström.

TECHNICAL FIELD

The present invention relates in general to homogenization of spatial intensity distributions of spatially coherent radiation beams.

BACKGROUND OF THE INVENTION

With ordinary light sources, light emitted by the source is usually of low optical coherence so that a fairly uniform light intensity profile is achieved at a target plane by superposing multiple wave fronts. In optical lithography or metrology an excimer laser is often used as a light source, and typically the radiation output from the laser is passed a radiation beam-scrambling illuminator to distribute the light intensity uniform over a particular area, e.g. an SLM area. Different laser sources have different coherence lengths. A problem is that coherent parts of a beam of radiation may sometimes cause an interference pattern on the target.

SUMMARY OF THE INVENTION

Accordingly it is an object of the present invention to provide an apparatus for homogenizing the spatial intensity distribution of a spatially coherent radiation beam, which overcomes or at least reduces the abovementioned problem of interference pattern of the radiation beam.

This object, among others, is according to a first aspect of the invention attained by an apparatus, which comprises a source of electromagnetic radiation, a first array (20) of deflecting elements (25) arranged to receive said electromagnetic radiation and to disperse said beam of electromagnetic radiation into a number of spatially separated beamlets, a second array (30) of deflecting elements (35) arranged to receive said beamlets deflected from said first lens array and to superimpose said spatially separated beamlets at a target plane (40) to thereby form a radiation beam having a homogenized spatial intensity distribution.

In another embodiment according to the invention, said beamlets from adjacent deflecting elements (25) in said first array (20) are impinged onto non adjacent deflecting elements (35) in said second array (30).

In another embodiment according to the invention, at least one of the deflecting elements (25) in said first array (20) comprises at least one prism to deflect said beamlets.

In another embodiment according to the invention, at least one of the deflecting elements (25) in said first array (20) comprises at least one grating to deflect said beamlets.

In another embodiment according to the invention, at least one of the deflecting elements (25) in said first array (20) comprises at least one Fresnel lens to deflect said beamlets.

In another embodiment according to the invention, said at least two beamlets are brought non-parallel between said first (20) and said second array (30).

In another embodiment according to the invention, said non-parallel beamlets are arranged in different planes in the space.

In another embodiment according to the invention, at least one array (20, 30) is transmissive.

In another embodiment according to the invention, at least one array (20, 30) is reflective.

In another embodiment according to the invention, a shape of an illuminated area of said first and said second array (20, 30) is different.

In another embodiment according to the invention, at least one deflecting element (25) in said first array (20) have a different shape than at least one deflecting element (35) in said second array (30).

In another embodiment according to the invention, a pattern of arrangement of the deflecting elements in said first array and said second array are different.

In another embodiment according to the invention, at least two deflecting elements in said first array are differently shaped.

In another embodiment according to the invention, at least two deflecting elements in said second array are differently shaped.

In another embodiment according to the invention, at least one of said first array and said second array is rotatable.

In another embodiment according to the invention, said deflecting elements comprise focusing power.

In another embodiment according to the invention, focusing power is accomplished by a separate lens arrangement arranged between said first array and said second array and/or said second array and said target plane.

A further object of the invention is to provide a method for homogenizing the spatial intensity distribution of a spatially coherent radiation beam, which overcomes or at least reduces the abovementioned problem of interference pattern of the radiation beam.

According to a second aspect of the invention there is provided a method for homogenizing a beam of electromagnetic radiation, comprising the actions of impinging said beam of electromagnetic radiation onto a first array of deflecting elements, dispersing said beam of electromagnetic radiation into a number of spatially separated beamlets by said first array of deflecting elements, deflecting said beamlets by said first array of deflecting elements, impinging said deflected beamlets onto a second array of deflecting elements, superimposing said beamlets at a target plane to thereby form a radiation beam having a homogenized spatial intensity distribution.

In another embodiment of the invention it further comprising the action of impinging beamlets from adjacent deflecting elements in said first array onto non-adjacent deflecting elements in said second array.

In another embodiment of the invention, at least one of the deflecting elements in said first and/or said second array comprises at least one prism to deflect said beamlets.

In another embodiment of the invention, at least one of the deflecting elements in said first array and/or second array comprises at least one grating to deflect said beamlets.

In another embodiment of the invention, at least one of the deflecting elements in said first array and/or second array comprises at least one Fresnel lens to deflect said beamlets.

In another embodiment of the invention, it further comprising the actions of bringing at least two beamlets non-parallel between said first and said second array.

In another embodiment of the invention, said non-parallel beamlets are arranged in different planes in the space.

In another embodiment of the invention, at least one array is transmissive.

In another embodiment of the invention, at least one array is reflective.

In another embodiment of the invention, a shape of an illuminated area of said first and said second array is different.

In another embodiment of the invention, at least one deflecting element in said first array has a different shape than at least one deflecting element in said second array.

In another embodiment of the invention, a pattern of arrangement of the deflecting elements in said first array and said second array are different.

In another embodiment of the invention, at least two deflecting elements in said first array are differently shaped.

In another embodiment of the invention, at least two deflecting elements in said second array are differently shaped.

In another embodiment of the invention, at least one of said first array and said second array is rotatable.

In another embodiment of the invention, said deflecting elements comprise focusing power.

In another embodiment of the invention, focusing power is accomplished by a separate lens arrangement arranged between said first array and said second array and/or said second array and said target plane.

Other aspects of the present invention are reflected in the detailed description, figures and claims.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
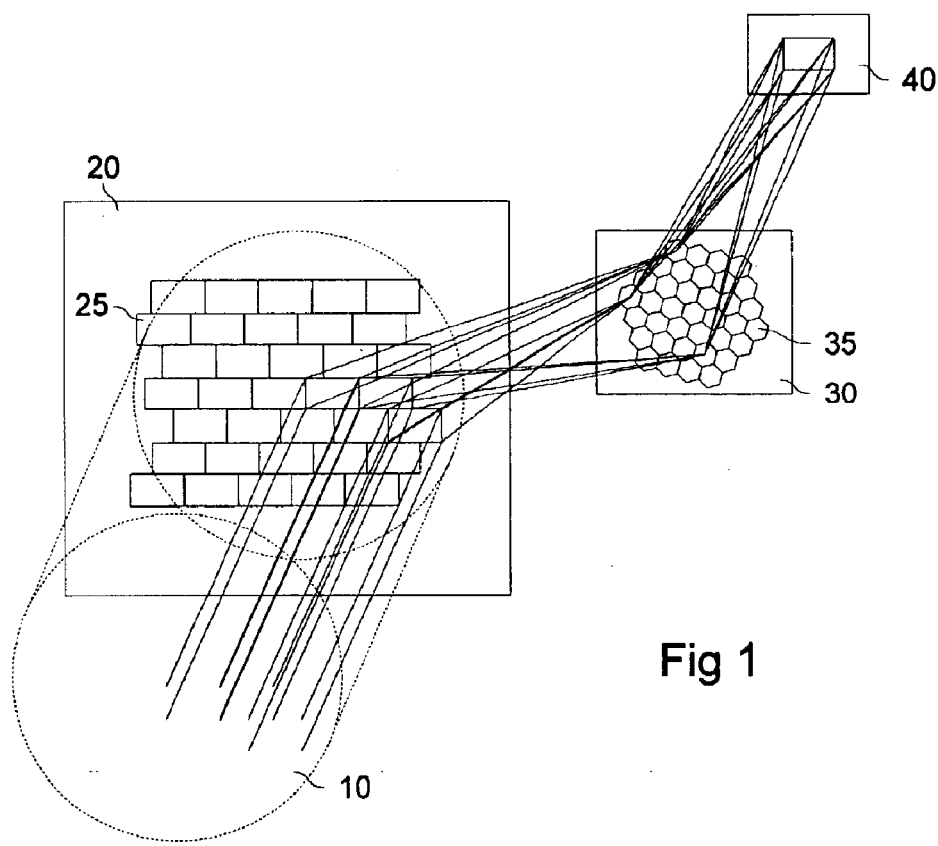
FIG. 1 depicts a perspective view of a first embodiment of the inventive homogenizer.

FIG. 1 illustrates a schematic perspective view of a first embodiment of a device for homogenizing a spatially coherent radiation beam according to the invention. Said device comprises a first array 20 of deflecting elements 25 and a second array 30 of deflecting elements 35.

The spatially coherent radiation beam may originate from a source of radiation, which typically is an excimer laser producing a broadband laser beam of for example rectangular cross section, e.g., 3 mm×6 mm.

In FIG. 1 said radiation beam, denoted by 10, has a circular shape originating from a radiation source, not indicated in the figure. Said radiation beam is incident on said first array 20 of deflecting elements 25, such as Fresnel lenses, gitter structures or prisms. Said deflecting elements 25 may have any kind of geometrical shape. In FIG. 1 the shape is indicated to be rectangular but any polygonal shape may be applicable. In FIG. 1 said rectangular shaped deflecting elements are arranged somewhat irregular, i.e., said deflecting elements are not arranged strictly on top of each other.

Facets of the deflecting elements in said array 20 may have a focusing power. Alternatively said focusing power is achieved with at least one separate lens arrangement arranged between said first array 20 and said second array 30.

The first and second array 20 may have 200 deflecting elements, preferably more than 400 deflecting elements.

The deflecting elements 25 disperse the incoming radiation beam 10 into a number, equal to the number of deflecting elements, of beamlets. Said beamlets are deflected by said deflecting elements 25 in one general direction. All beamlets are dispersed in spatially different directions. Beamlets originating from two adjacent deflecting elements 25 in said first array 20 will end up in two non-adjacent deflecting elements 35 in said second array 30. At least two beamlets, and preferably all beamlets, are non-parallel between said first and second array, 20 and 30 respectively. Preferably they are non-parallel in both an x direction and a y direction and not lying in the same plane.

The shape of an illuminated area of said first and second array, 20 and 30 respectively, may be different.

The deflecting elements 25 may have a different shape compared to the deflecting elements 35. Individual deflecting elements within array 20 or 30 may be different. All deflecting elements 25, 35 may have a different shape. The array 20, 30 of deflecting elements 25, 35 may be produced by CSEM in Switzerland, by Hexagon in Finland or by DOC in North Carolina USA.

One of the arrays 20, 30 may be arranged rotatable. By rotating one array relative the other may enhance the homogenization further.

For diffractive deflecting elements a phase is varied between adjacent deflecting elements, so that an averaging over different phases occur in a homogenized area at a target plane 40.

Figure 2:
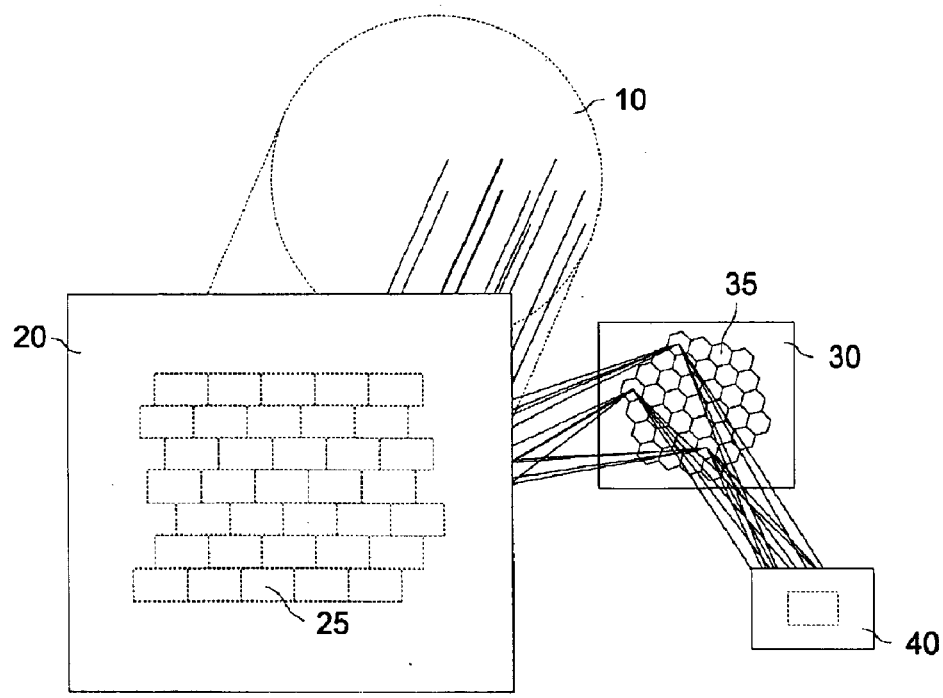
FIG. 2 depicts a perspective view of a second embodiment of the inventive homogenizer.

In FIG. 1 said first and second array are made to be transmissive. In FIG. 2 said arrays are made to be reflective. For transmissive diffractive arrays it is preferable to expose a pattern in a resist by photons or electrons. A surface profile is developed and said profile is etched into the substrate, typically made of fused silica or calcium fluoride. For reflective arrays it is not necessary to transfer the pattern to a transparent substrate. Instead it is possible to use the resist profile directly, either by depositing a mirror film on the resist or by making a molded replica, such as in electro deposited copper, electrolysis deposited nickel, molding with a thermosetting or hardening polymer. Effective diffractive pattern needs a much smaller profile depth than transmissive one, therefore non-conventional resist processes can be used to create the surface profile, e.g., the resist loss after exposure. It is also possible to add a selective agent such as silane compounds that react and add thickness only where the resist has been exposed.

The radiation source may be an excimer laser at any wavelength such as UV, DUV, EUV etc. In particular this invention is suitable for use in pattern generators and metrology and inspection systems that use a uniform illumination by an excimer laser or other electromagnetic radiation sources.

While the preceding examples are cast in terms of a method, devices and systems employing this method are easily understood. A magnetic memory containing a program capable of practicing the claimed method is one such device. A computer system having memory loaded with a program practicing the claimed method is another such device.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

I claim:

1. A method for homogenizing a beam of electromagnetic radiation, comprising the actions of:
   impinging said beam of electromagnetic radiation onto a first array of deflecting elements,
   deflecting said beam of electromagnetic radiation into numerous spatially separated beamlets by said first array of deflecting elements,
   impinging said deflected beamlets onto a second array of deflecting elements, and
   superimposing said beamlets from the second array of deflecting elements at a target plane whereby a radiation beam having a homogenized spatial intensity distribution is formed;
   wherein the spatially separated beamlets from at least two adjoining deflecting elements of said first array impinge on non-adjoining deflecting elements of said second array.

2. The method according to claim 1, further including focusing the deflected beamlets through a separate lens arrangement placed between said first and second arrays and/or between said second array and said target plane.

3. The method according to claim 1, wherein at least one of the deflecting elements in said first array and/or second array comprises at least one prism.

4. The method according to claim 1, wherein at least one of the deflecting elements in said first array and/or second array comprises at least one grating.

5. The method according to claim 1, wherein at least one of the deflecting elements in said first array and/or second array comprises at least one Fresnel lens.

6. The method according to claim 1, wherein at least two beamlets deflected from adjacent elements of said first array are transmitted non-parallel between said first and second arrays.

7. The method according to claim 1, wherein at least one array is transmissive.

8. The method according to claim 1, wherein at least one array is reflective.

9. The method according to claim 1, wherein shapes of illuminated areas of said first and second arrays are different.

10. The method according to claim 1, wherein at least one deflecting element in said first array has a different shape than at least one deflecting element in said second array.

11. The method according to claim 1, wherein patterns of arrangement of the deflecting elements in said first and second arrays are different.

12. The method according to claim 1, wherein at least two deflecting elements in said first array are differently shaped.

13. The method according to claim 1, wherein at least two deflecting elements in said second array are differently shaped.

14. The method according to claim 1, wherein at least one of said first array and said second array is rotatable.

15. The method according to claim 1, wherein at least some of said deflecting elements comprise focusing power.

16. An apparatus for homogenizing a beam of electromagnetic radiation comprising:
    a source of electromagnetic radiation
    a first array of deflecting elements arranged to receive said electromagnetic radiation and to deflect said beam of electromagnetic radiation into a number of spatially separated beamlets,
    a second array of deflecting elements arranged to receive said beamlets deflected from said first lens array and to superimpose said spatially separated beamlets at a target plane whereby a radiation beam having a homogenized spatial intensity distribution is formed;
    wherein the spatially separated beamlets from at least two adjoining deflecting elements of said first array impinge on non-adjoining deflecting elements of said second array.

17. The apparatus according to claim 16, wherein at least some of said deflecting elements comprise focusing power.

18. The apparatus according to claim 16, wherein focusing power is accomplished by a separate lens arrangement arranged between said first array and said second array and/or said second array and said target plane.

19. The apparatus according to claim 16, wherein at least one of the deflecting elements in said first and/or second arrays comprises at least one prism.

20. The apparatus according to claim 16, wherein at least one of the deflecting elements in said first and/or second arrays comprises at least one grating.

21. The apparatus according to claim 16, wherein at least one of the deflecting elements in said first and/or second arrays comprises at least one Fresnel lens.

22. The apparatus according to claim 16, wherein said at least two beamlets from adjacent deflecting elements are brought non-parallel between said first and said second array.

23. The apparatus according to claim 16, wherein at least one of the arrays is transmissive.

24. The apparatus according to claim 16, wherein at least one of the arrays is reflective.

25. The apparatus according to claim 16, wherein a shape of illuminated areas of said first and said second arrays are different.

26. The apparatus according to claim 16, wherein at least one deflecting element in said first array has a different shape than at least one deflecting element in said second array.

27. The apparatus according to claim 16, wherein patterns of arrangement of the deflecting elements in said first array and said second array are different.

28. The apparatus according to claim 16, wherein at least two deflecting elements in said first array are differently shaped.

29. The apparatus according to claim 16, wherein at least two deflecting elements in said second array are differently shaped.

30. The apparatus according to claim 16, wherein at least one of said first array and said second array is rotatable.

* * * * *